United States Patent
Naruse et al.

(10) Patent No.: US 11,769,720 B2
(45) Date of Patent: Sep. 26, 2023

(54) ELECTRONIC SUBSTRATE WITH FIRST AND SECOND WIRINGS SUPPLIED WITH SAME POTENTIAL

(71) Applicant: AISIN CORPORATION, Aichi (JP)

(72) Inventors: Takanobu Naruse, Kariya (JP); Yasuhiro Sassa, Kariya (JP)

(73) Assignee: AISIN CORPORATION, Aichi (JP)

( * ) Notice: Subject to any disclaimer, the term of this patent is extended or adjusted under 35 U.S.C. 154(b) by 174 days.

(21) Appl. No.: 17/417,621

(22) PCT Filed: Oct. 31, 2019

(86) PCT No.: PCT/JP2019/042767
§ 371 (c)(1),
(2) Date: Jun. 23, 2021

(87) PCT Pub. No.: WO2020/194832
PCT Pub. Date: Oct. 1, 2020

(65) Prior Publication Data
US 2022/0084929 A1   Mar. 17, 2022

(30) Foreign Application Priority Data

Mar. 28, 2019  (JP) ................................. 2019-062292

(51) Int. Cl.
*H01L 23/498*   (2006.01)
*H01L 23/538*   (2006.01)
*H01L 23/00*   (2006.01)

(52) U.S. Cl.
CPC .................. *H01L 23/49838* (2013.01); *H01L 23/49827* (2013.01); *H01L 23/5386* (2013.01);
(Continued)

(58) Field of Classification Search
CPC ......... H01L 23/49838; H01L 23/49827; H01L 23/5386; H01L 24/14; H01L 24/16
See application file for complete search history.

(56) References Cited

U.S. PATENT DOCUMENTS

| | | |
|---|---|---|
| 5,640,048 A | 6/1997 | Selna |
| 2006/0175083 A1* | 8/2006 | Muramatsu ....... H01L 23/49822 257/E23.079 |

(Continued)

FOREIGN PATENT DOCUMENTS

| | | |
|---|---|---|
| JP | 2011-096268 A | 5/2011 |
| JP | 2011-103405 A | 5/2011 |
| WO | 2016/208081 A1 | 12/2016 |

OTHER PUBLICATIONS

International Search Report for PCT/JP2019/042767 dated Dec. 24, 2019 [PCT/ISA/210].

(Continued)

*Primary Examiner* — Michael Jung
(74) *Attorney, Agent, or Firm* — Sughrue Mion, PLLC

(57) ABSTRACT

An electronic substrate connects to a semiconductor component via a plurality of front surface terminals disposed in an array on a front surface and connects to a main substrate via a plurality of back surface terminals disposed in an array on a back surface. The electronic substrate includes: a first wiring that electrically connects the front surface terminals and the back surface terminals in the electronic substrate and is supplied with power supply from the main substrate via the back surface terminals; and a second wiring that electrically connects the front surface terminals and the back surface terminals in the electronic substrate, is supplied with power supply having the same potential as the first wiring from the main substrate via the back surface terminals, and is not electrically connected to the first wiring in the electronic substrate.

6 Claims, 4 Drawing Sheets

(52) U.S. Cl.
CPC .............. *H01L 24/14* (2013.01); *H01L 24/16* (2013.01); *H01L 2224/14132* (2013.01); *H01L 2224/16225* (2013.01)

(56) References Cited

U.S. PATENT DOCUMENTS

| | | |
|---|---|---|
| 2007/0192559 A1 | 8/2007 | Betsui et al. |
| 2009/0290316 A1* | 11/2009 | Kariya ................... H01L 23/50 361/767 |
| 2012/0079238 A1 | 3/2012 | Betsui et al. |
| 2013/0128647 A1 | 5/2013 | Betsui et al. |
| 2014/0160826 A1 | 6/2014 | Betsui et al. |
| 2015/0036406 A1 | 2/2015 | Betsui et al. |
| 2017/0062020 A1 | 3/2017 | Betsui et al. |
| 2017/0062021 A1 | 3/2017 | Betsui et al. |
| 2017/0213776 A1 | 7/2017 | Oikawa et al. |
| 2017/0278781 A1* | 9/2017 | Taguchi ................. H01L 23/50 |
| 2018/0301172 A1 | 10/2018 | Betsui et al. |

OTHER PUBLICATIONS

Extended European Search Report dated Apr. 19, 2022 in European Application No. 19921391.9.

* cited by examiner

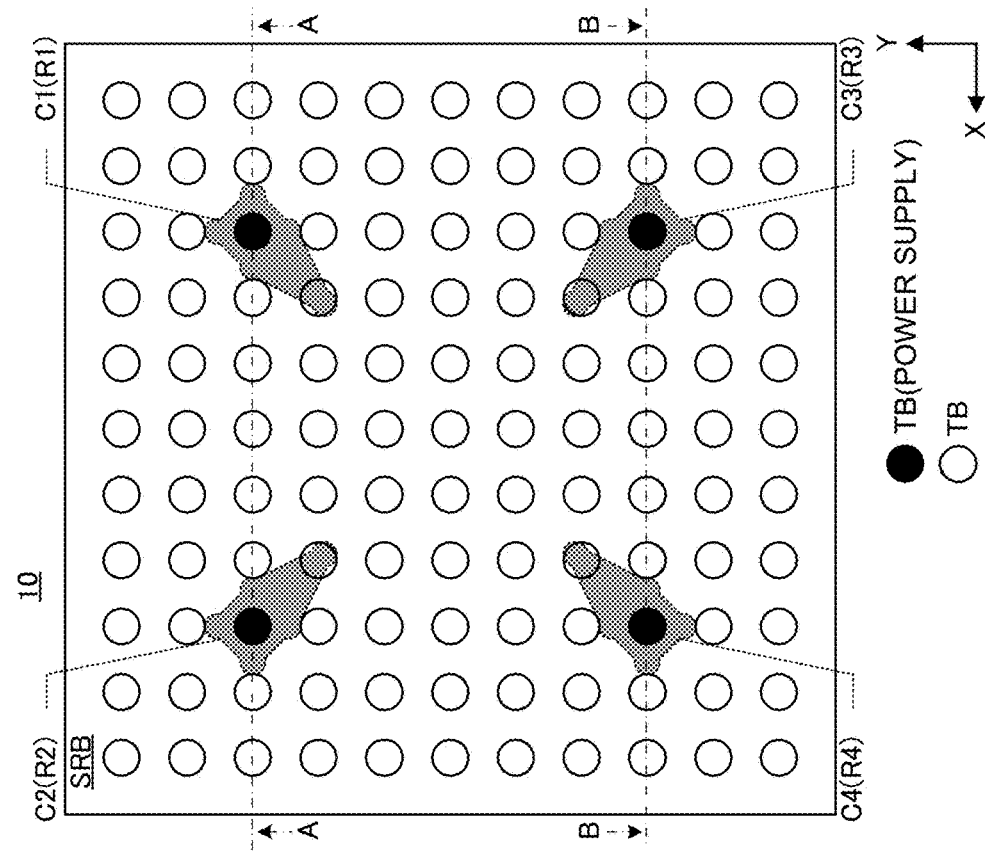
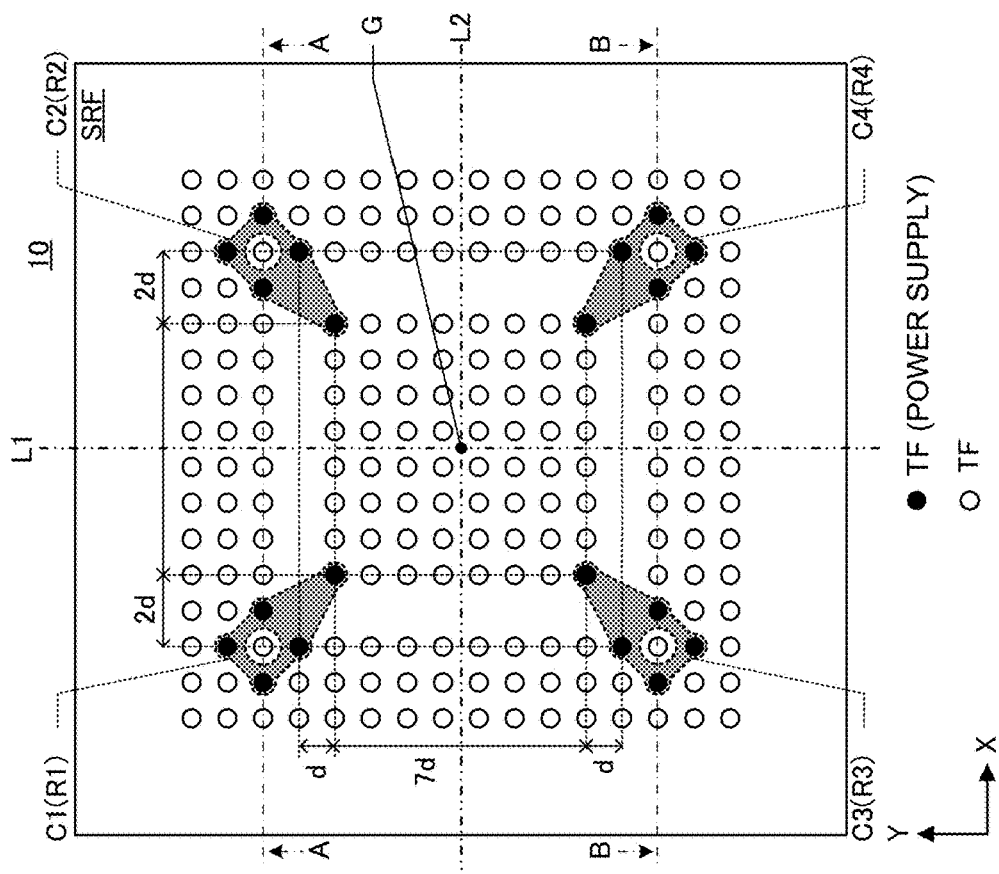
FIG.2A
FIG.2B

ELECTRONIC SUBSTRATE WITH FIRST AND SECOND WIRINGS SUPPLIED WITH SAME POTENTIAL

CROSS REFERENCE TO RELATED APPLICATIONS

This application is a National Stage of International Application No. PCT/JP2019/042767 filed Oct. 31, 2019, claiming priority based on Japanese Patent Application No. 2019-062292 filed Mar. 28, 2019, the contents of which are incorporated by reference in their entirety.

TECHNICAL FIELD

The present disclosure relates to an electronic substrate.

BACKGROUND ART

There is known a multi-chip module substrate on which a plurality of semiconductor components (MCU-CHIP, DDR2-SDRAM) are mounted (see Patent Document 1). In Patent Document 1, a power supply plane is provided on the multi-chip module substrate.

RELATED ART DOCUMENTS

Patent Documents

Patent Document 1: Japanese Unexamined Patent Application Publication No. 2011-96268 (JP 2011-96268 A)

SUMMARY OF THE DISCLOSURE

Problem to be Solved by Various Aspects of the Disclosure

In general, the power supply plane connects to all the ball electrodes for supplying power supply of the semiconductor component, thereby occupying a large area in the conductor layer. Since such a power supply plane interferes with other wiring patterns such as signal lines, a dedicated conductor layer for the power supply plane must be provided. Therefore, there has been an issue that the number of layers of the substrate is increased. In particular, in Patent Document 1, since the power supply plane is provided over the ball electrodes of a plurality of semiconductor components, the power supply plane occupies a wider range in the conductor layer. The present disclosure has been made in view of the above issue and an object of the present disclosure is to provide a technology that can reduce the number of layers of the electronic substrate.

Means for Solving the Problem

In order to achieve the above object, the electronic substrate of the present disclosure is an electronic substrate that connects to a semiconductor component via a plurality of front surface terminals disposed in an array on a front surface and connects to a main substrate via a plurality of back surface terminals disposed in an array on a back surface. The electronic substrate includes: a first wiring that electrically connects the front surface terminals and the back surface terminals in the electronic substrate and is supplied with power supply from the main substrate via the back surface terminals; and a second wiring that electrically connects the front surface terminals and the back surface terminals in the electronic substrate, is supplied with power supply having the same potential as the first wiring from the main substrate via the back surface terminals, and is not electrically connected to the first wiring in the electronic substrate.

In the present disclosure having the above configuration, the power supply having the same potential can be supplied to the semiconductor component by both of the front surface terminals connected to the first wiring and the front surface terminals connected to the second wiring. Here, since the first wiring and the second wiring are not electrically connected in the electronic substrate, it is not necessary to form a wiring pattern in the electronic substrate that electrically connects the front surface terminals connected to the first wiring and the front surface terminals connected to the second wiring. That is, the wiring pattern of the power supply can be reduced in the electronic substrate, and the degree of freedom of other wiring patterns such as signal lines can be improved. As a result, a conductor layer dedicated for the wiring pattern of the power supply can be omitted, and the number of layers of the electronic substrate can be reduced.

BRIEF DESCRIPTION OF THE DRAWINGS

FIG. 2A is a perspective view of a front surface of the electronic substrate, and FIG. 2B is a perspective view of a back surface of the electronic substrate.

DETAILED DESCRIPTION

Here, embodiments of the present disclosure will be described in the following order.
(1) First embodiment:
(2) Second embodiment:
(3) Third embodiment:
(4) Other embodiments:

(1) First Embodiment

Figure 1:
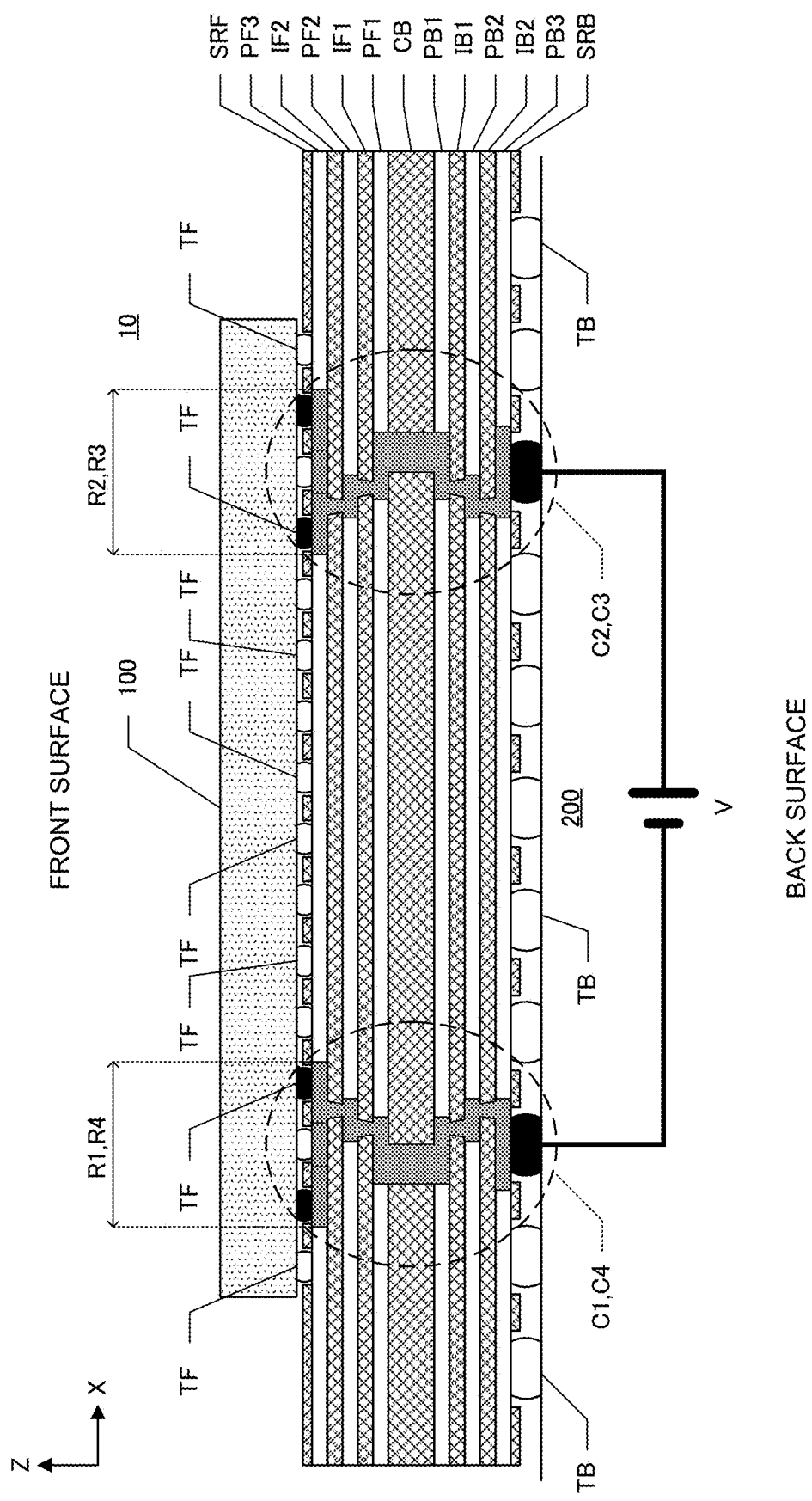
FIG. 1 is a schematic sectional view of an electronic substrate.

FIG. 1 is a schematic sectional view of an electronic substrate 10 according to an embodiment of the present disclosure. The electronic substrate 10 is a rectangular plate-shaped other-layer substrate, and a plurality of layers are laminated in the thickness direction Z. One side of the electronic substrate 10 in the thickness direction Z (upper side of the paper surface) is defined as a front surface, and the other side in the thickness direction Z (lower side of the paper surface) is defined as the front surface. The electronic substrate 10 includes six layers of conductor layers PF1, PF2, PF3, PB1, PB2, and PB3 and seven layers of insulating layers CC, IF1, IF2, SRF, IB1, IB2, and SRB. The electronic substrate 10 of the present embodiment is a double-sided build-up substrate in which each layer is laminated on an insulating layer CC which is a core substrate. However, the electronic substrate 10 may be a single-sided substrate or a substrate that does not have a core substrate. The number of layers of the electronic substrate 10 is not limited to that illustrated in FIG. 1.

A wiring pattern in the surface direction XY (orthogonal direction of the thickness direction Z) is formed in the conductor layers PF1, PF2, PF3, PB1, PB2, and PB3. The method for forming the wiring pattern is not particularly limited, and may be formed by, for example, an additive method, a semi-additive method, or a subtractive method. Through-holes are formed in the insulating layer CC, and the conductor layers PF1 and PB1 are electrically connected via through-hole conductors formed in the through-holes. The through-hole conductors may cover the wall surfaces of the through-holes or may fill the inside of the through-holes.

Vias are formed in the insulating layer IF1, and the conductor layers PF1 and PF2 are electrically connected via the vias of the insulating layer IF1. Similarly, the conductor layers PF2 and PF3 are electrically connected via the vias of the insulating layer IF2, the conductor layers PB1 and PB2 are electrically connected via the vias of the insulating layer IB1, and the conductor layers PB2 and PB3 are electrically connected via the vias of the insulating layer IB2. The method of forming the vias is not particularly limited, and for example, the vias may be photo vias or laser vias.

The insulating layer SRF on the front surface side is a solder resist, and is formed on the conductor layer PF3 on the frontmost surface side. A plurality of openings are formed in the insulating layer SRF, and a front surface terminal TF is formed in each of the plurality of openings. The front surface terminal TF is a bump formed by solder or the like, and is used for flip-chip mounting a semiconductor component 100 on the electronic substrate 10.

The insulating layer SRB on the back surface side is also a solder resist, and is formed on the conductor layer PB3 on the backmost surface side. A plurality of openings are formed in the insulating layer SRB, and a back surface terminal TB is formed in each of the plurality of openings. The back surface terminal TB is a ball formed by solder or the like, and is used for surface mounting the electronic substrate 10 on a main substrate 200. The electronic substrate 10 is mounted on the main substrate 200 with the semiconductor component 100 mounted on the electronic substrate 10.

FIG. 2A shows the front surface of the electronic substrate 10. In FIG. 2A, the front surface terminals TF are indicated by white circles or black circles. As shown in FIG. 2A, the plurality of front surface terminals TF are disposed in an array on the front surface of the electronic substrate 10. The front surface terminals TF are disposed so as to be distanced away from each other by a constant bump pitch d in each of the surface directions XY.

FIG. 2B shows the back surface of the electronic substrate 10. FIG. 2B shows a state in which the electronic substrate 10 is turned over around the Y axis from the state of FIG. 2A. In FIG. 2B, the back surface terminals TB are indicated by white circles or black circles. As shown in FIG. 2B, the plurality of back surface terminals TB are disposed in an array on the back surface of the electronic substrate 10. Note that FIG. 1 is a sectional view taken along the arrow lines AA and BB (long dashed short dashed lines) of FIGS. 2A and 2B.

As described above, the electronic substrate 10 is connected to the semiconductor component 100 via the plurality of front surface terminals TF disposed in an array on the front surface. Further, the electronic substrate 10 is connected to the main substrate 200 via the plurality of back surface terminals TB disposed in an array on the back surface.

A power supply circuit (not shown) for generating a power supply V to be supplied to the semiconductor component 100 is formed on the main substrate 200. FIG. 1 virtually shows a circuit diagram of a circuit for supplying the power supply V to the electronic substrate 10. The power supply V is supplied to each of the four back surface terminals TB shown in black in FIGS. 1 and 2B.

The electronic substrate 10 includes a first wiring C1, a second wiring C2, a third wiring C3, and a fourth wiring C4 as wirings to be connected to the power supply V. The first to fourth wirings C1 to C4 are integrated conductors that electrically connect the front surface terminals TF and the back surface terminals TB in the electronic substrate 10, and to which power supply is supplied from the main substrate 200 via the back surface terminals TB. The first to fourth wirings C1 to C4 are not electrically connected to each other in the electronic substrate 10.

The first to fourth wirings C1 to C4 have a structure that is rotationally symmetric with respect to the center point G in the surface direction XY, and the sections in the arrow lines AA and BB can be illustrated with a common sectional view (FIG. 1). In FIG. 1, the first to fourth wirings C1 to C4 are shown in gray and black. As shown in FIG. 1, the first to fourth wirings C1 to C4 are constituted of the wiring patterns formed in the surface direction XY in the conductor layers PF1, PF2, PF3, PB1, PB2, and PB3, the vias formed in the insulating layers IF1, IF2, IB1, and IB2, the through-hole conductors formed in the insulating layer CC, the front surface terminals TF, and the back surface terminals TB. Note that in FIG. 1, wirings other than the first to fourth wirings C1 to C4 are not shown.

In FIGS. 2A and 2B, first to fourth regions R1 to R4 (perspective images), which are regions in which the wiring patterns constituting the first to fourth wirings C1 to C4 are formed in the conductor layer PF3 on the frontmost surface side, are shown in gray. Of the wiring patterns of the conductor layer PF3, the bumps formed in the openings of the insulating layer SRF (solder resist) on the front surface side are the front surface terminals TF. Each of the first to fourth wirings C1 to C4 is electrically connected to the five front surface terminals TF shown in black. There are a total of 20 front surface terminals TF for supplying the power supply V to the semiconductor component 100.

Here, in the surface direction XY of the electronic substrate 10, it is possible to define one straight line L1 that divides the first region R1 in which the front surface terminals TF connected to the first wiring C1 are distributed and the second and fourth regions R2, R4 in which the front surface terminals TF connected to the second and fourth wirings C2 and C4 are distributed. Further, it is possible to define one straight line L2 that divides the first region R1 in which the front surface terminals TF connected to the first wiring C1 are distributed and the third and fourth regions R3, R4 in which the front surface terminals TF connected to the third and fourth wirings C3 and C4 are distributed.

In this way, by making the first region R1 and the second region R2 dividable by one straight line L1, the front surface terminals TF connected to the first wiring C1 and the front surface terminals TF connected to the second wiring C2 can be made so as not be intricately present on the surface of the electronic substrate 10. As a result, the wiring pattern of the first wiring C1 and the wiring pattern of the second wiring C2 in the conductor layers do not have to have a complicated shape, and the degree of freedom of other wiring patterns such as signal lines can be improved.

The maximum value of the distance between the front surface terminals TF connected to the first wiring C1 is the square root of $d^2+(2d)^2$, which is about 2.24d. The maximum value of the distance between the front surface terminals TF connected to each of the second to fourth wirings C2 to C4 is also about 2.24d.

On the other hand, the minimum value of the distance between the front surface terminals TF connected to the first wiring C1 and the front surface terminals TF connected to the second wiring C2 is 7d. Similarly, the minimum value of the distance between the front surface terminals TF connected to the first wiring C1 and the front surface terminals TF connected to the third wiring C3 is also 7d, the minimum value of the distance between the front surface terminals TF connected to the second wiring C2 and the front surface terminals TF connected to the fourth wiring C4 is also 7d, and the minimum value of the distance between the front surface terminals TF connected to the third wiring C3 and the front surface terminals TF connected to the fourth wiring C4 is also 7d. Further, the minimum value of the distance between the front surface terminals TF connected to the first wiring C1 and the front surface terminals TF connected to the fourth wiring C4 is the square root of $(7d)^2+(7d)^2$, which is about 9.90d. Similarly, the minimum value of the distance between the front surface terminals TF connected to the second wiring C2 and the front surface terminals TF connected to the third wiring C3 is also about 9.90d.

As described above, the distance between the front surface terminals TF connected to the first wiring C1 and the distance between the front surface terminals TF connected to the second wiring C2 are shorter than the distance between the front surface terminals TF connected to the first wiring C1 and the front surface terminals TF connected to the second wiring C2. Similarly, the distance between the front surface terminals TF connected to the first wiring C1 and the distance between the front surface terminals TF connected to the third wiring C3 are shorter than the distance between the front surface terminals TF connected to the first wiring C1 and the front surface terminals TF connected to the third wiring C3. The distance between the front surface terminals TF connected to the first wiring C1 and the distance between the front surface terminals TF connected to the fourth wiring C4 are shorter than the distance between the front surface terminals TF connected to the first wiring C1 and the front surface terminals TF connected to the fourth wiring C4.

Furthermore, the distance between the front surface terminals TF connected to the second wiring C2 and the distance between the front surface terminals TF connected to the third wiring C3 are shorter than the distance between the front surface terminals TF connected to the second wiring C2 and the front surface terminals TF connected to the third wiring C3. The distance between the front surface terminals TF connected to the second wiring C2 and the distance between the front surface terminals TF connected to the fourth wiring C4 are shorter than the distance between the front surface terminals TF connected to the second wiring C2 and the front surface terminals TF connected to the fourth wiring C4. The distance between the front surface terminals TF connected to the third wiring C3 and the distance between the front surface terminals TF connected to the fourth wiring C4 are shorter than the distance between the front surface terminals TF connected to the third wiring C3 and the front surface terminals TF connected to the fourth wiring C4.

By connecting the front surface terminals TF located close to each other to the first wiring C1 in this way, the area of the wiring pattern for the first wiring C1 (first region R1) can be reduced, and the degree of freedom of other wiring patterns such as signal lines can be improved. Similarly, by connecting the front surface terminals TF located close to each other to each of the second to fourth wirings C2 to C4, the areas of the wiring patterns for the second to fourth wirings C2 to C4 (second to fourth areas R2 to R4) can be reduced.

Further, in the surface direction XY of the electronic substrate 10, the back surface terminal TB connected to the first wiring C1 exists inside the first region R1 in which the front surface terminals TF connected to the first wiring C1 are distributed. As shown in FIGS. 1 and 2B, the back surface terminal TB connected to the first wiring C1 exists directly below the first region R1 in which the wiring pattern constituting the first wiring C1 is formed in the conductor layer PF3 on the frontmost surface side. This is because the first wiring C1 is a wiring for connecting the conductors only in the substantially thickness direction Z in the layers other than the conductor layer PF3 on the frontmost surface side. Similarly, in the surface direction XY of the electronic substrate 10, the back surface terminals TB connected to the second to fourth wirings C2 to C4 respectively exist inside the second to fourth regions R2 to R4 in which the front surface terminals TF connected to the second to fourth wirings C2 to C4 are distributed in the conductor layer PF3 on the frontmost surface side.

As a result, the back surface terminals TB connected to the first to fourth wirings C1 to C4 can be disposed directly below the first to fourth regions R1 to R4 in which the front surface terminals TF connected to the first to fourth wirings C1 to C4 are distributed. As a result, the wiring lengths of the first to fourth wirings C1 to C4 can be shortened, and the resistance of the first to fourth wirings C1 to C4 can be reduced.

In the present embodiment described above, the power supply V having the same potential can be supplied to the semiconductor component 100 by both of the front surface terminals TF connected to the first wiring C1 and the front surface terminals TF connected to the second wiring C2. Here, since the first wiring C1 and the second wiring C2 are not electrically connected in the electronic substrate 10, it is not necessary to form a wiring pattern in the electronic substrate 10 that electrically connects the front surface terminals TF connected to the first wiring C1 and the front surface terminals TF connected to the second wiring C2. That is, the wiring pattern of the power supply V can be reduced in the electronic substrate 10, and the degree of freedom of other wiring patterns such as signal lines can be improved. As a result, a conductor layer dedicated for the wiring pattern of the power supply can be omitted, and the number of layers of the electronic substrate 10 can be reduced.

Note that, in the electronic substrate 10, wiring patterns (not shown) other than the first to fourth wirings C1 to C4 such as signal lines are provided. In the conductor layer PF3 on the frontmost surface side, other wiring patterns such as these signal lines must be formed so as to avoid the first to fourth regions R1 to R4. Many other wiring patterns such as signal lines are routed in the radial direction from the center point G. Since the first to fourth regions R1 to R4 have an elongated shape in the radial direction (a shape where the length in the radial direction is longer than the length in the direction orthogonal to the radial direction), the possibility that the first to fourth regions R1 to R4 interfere with other wiring patterns such as signal lines can be reduced. Further, as described above, since the first to fourth wirings C1 to C4 are wirings for connecting conductors only substantially in the thickness direction Z in the layers other than the conductor layer PF3 on the frontmost surface side, other wiring patterns such as signal lines can be freely routed in the conductor layers PF2, PF1, PB1, PB2, and PB3 other than the conductor layer PF3.

Further, since the first to fourth wirings C1 to C4 have a structure that is rotationally symmetric with respect to the center point G in the surface direction XY, the electrical characteristics (resistance, etc.) of the first to fourth wirings C1 to C4 can be made almost identical, and power supply can be uniformly supplied to the semiconductor component 100.

(2) Second Embodiment

Figure 3B:
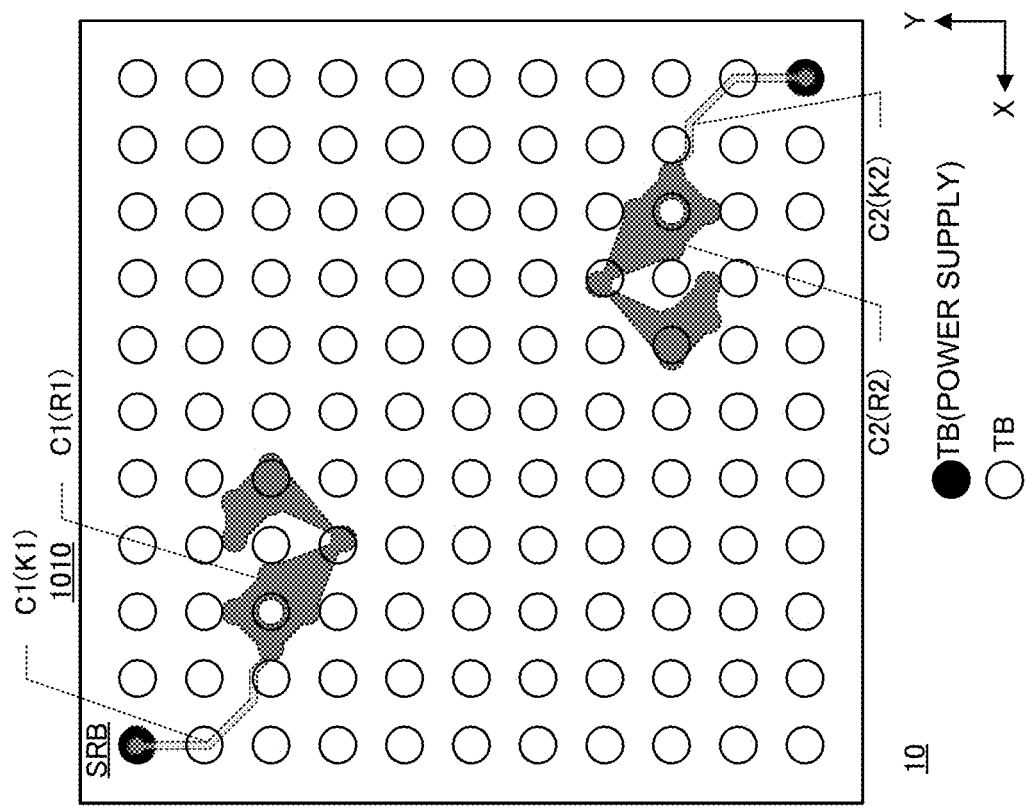
FIG. 3B is a perspective view of a back surface of the electronic substrate.
Figure 3A:
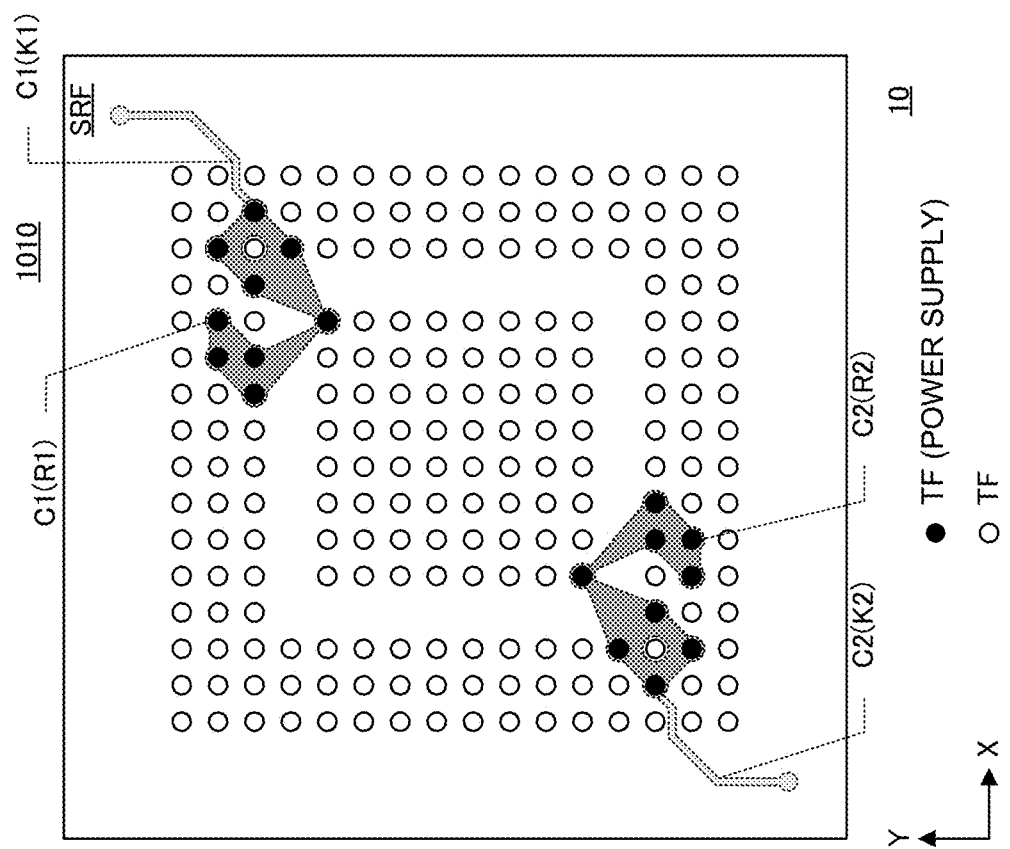
FIG. 3A is a perspective view of a front surface of an electronic substrate.

FIGS. 3A and 3B show the front surface and the back surface of an electronic substrate 1010 according to a second embodiment. Also in the present embodiment, the wiring patterns constituting the first to second wirings C1 to C2 are formed in the conductor layer PF3 on the frontmost surface side. Of the wiring pattern of the conductor layer PF3, a part formed in the portion where the front surface terminals TF (black circles) to which the power supply V is supplied exist is represented by first to second basic regions R1 to R2, and the first to second basic regions R1 to R2 (perspective images) are shown in dark gray. Further, of the wiring pattern of the conductor layer PF3, a part formed in the portion where the front surface terminals TF to which the power supply V is supplied do not exist is represented by first to second expansion regions K1 to K2, and the first to second expansion regions K1 to K2 (perspective images) are shown in light gray.

The first basic region R1 and the first expansion region K1 constitute an integral wiring pattern, and the second basic region R2 and the second expansion region K2 also constitute an integral wiring pattern. Of the first to second expansion regions K1 to K2, the end portion on the side not connected to the first to second expansion regions K1 to K2 and the back surface terminals TB (black circles) are connected in the thickness direction Z via vias and through-hole conductors.

In the present embodiment, in the surface direction XY of the electronic substrate 1010, the back surface terminal TB connected to the first wiring C1 exists outside the first basic region R1 in which the front surface terminals TF connected to the first wiring C1 are distributed. Similarly, the back surface terminal TB connected to the second wiring C2 also exists outside the second basic region R2 in which the front surface terminals TF connected to the second wiring C2 are distributed. Thus, the back surface terminals TB connected to the first to second wirings C1 to C2 can be disposed near the outer edge of the electronic substrate 1010. Instead, the back surface terminals TB connected to the signal lines or the like can be disposed near the center of the electronic substrate 1010. The first to second expansion regions K1 to K2 do not have to be formed in the same conductor layer PF3 as the first to second basic regions R1 to R2, and may be formed in a conductor layer PF2, PF1, PB1, PB2, and PB3 different from that for the first to second basic regions R1 to R2.

(3) Third Embodiment

Figure 4:
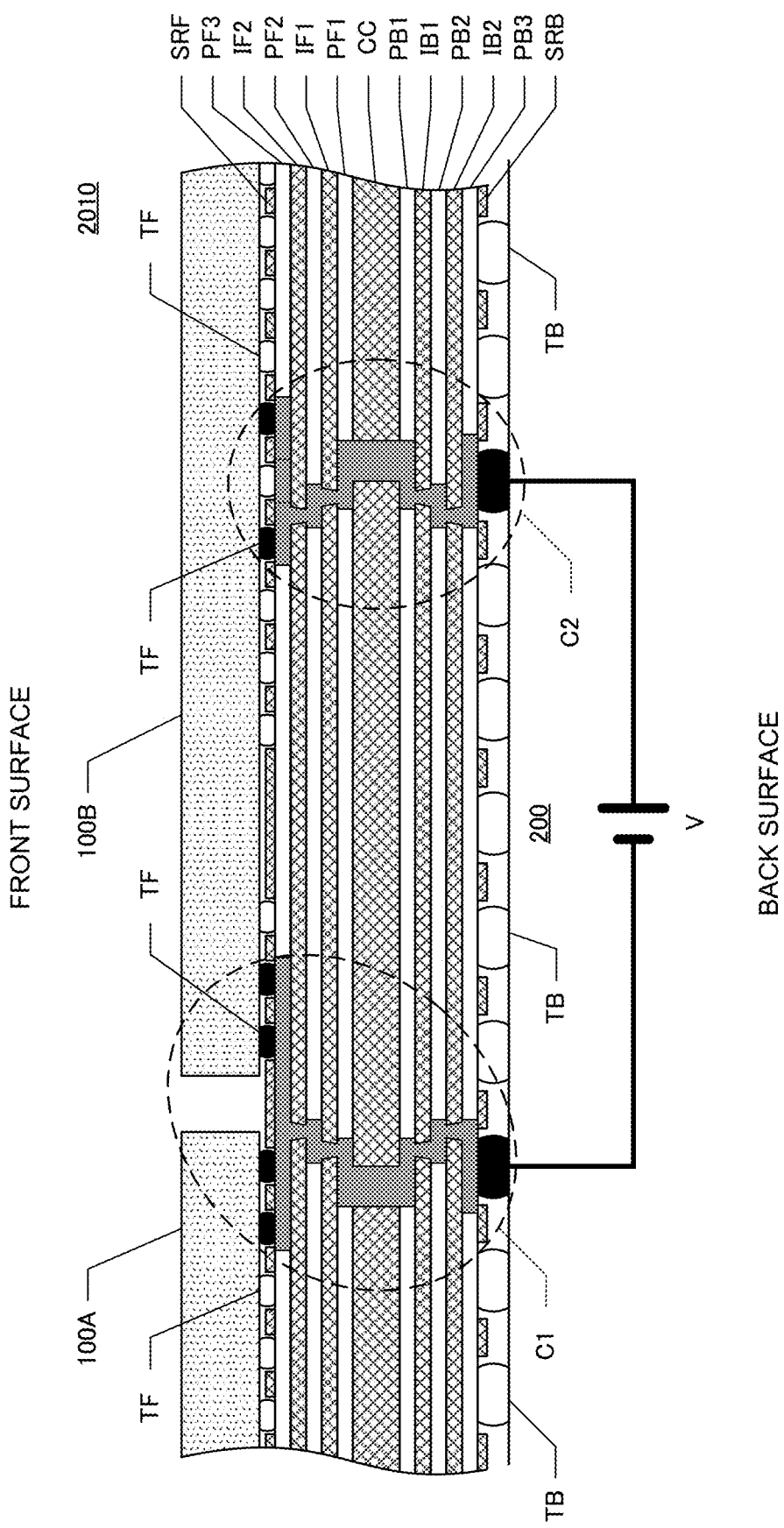
FIG. 4 is a schematic sectional view of an electronic substrate.

FIG. 4 is a schematic sectional view of an electronic substrate 2010 according to a third embodiment. The electronic substrate 2010 is a multi-chip module (MCM) substrate, and a first semiconductor component 100A and a second semiconductor component 100B are mounted on the electronic substrate 2010 on the front surface. The first wiring C1 is connected to both of the front surface terminals TF connected to the first semiconductor component 100A and the front surface terminals TF connected to the second semiconductor component 100B. As a result, the power supply V can be supplied to both of the first semiconductor component 100A and the second semiconductor component 100B via the first wiring C1.

(4) Other Embodiments

In the above, the electronic substrates 10, 1010, 2010 having the number of wirings connected to the power supply V of four and two are illustrated, but the number of wirings for supplying the power supply V only needs to be two or more. Further, the shape of the wirings for supplying the power supply V does not have to be symmetrical to each other. Further, the number of front surface terminals TF connected to the wirings for supplying the power supply V does not necessarily have to be equal. Furthermore, the number of back surface terminals TB connected to the wiring for supplying the power supply V may be two or more.

An electronic substrate of the present disclosure is a substrate having a front surface on one side in the thickness direction and a back surface on the other side in the thickness direction, and is a substrate on which a semiconductor component is flip-chip mounted on the front surface. Front surface terminals only needs to be disposed in an array in the surface direction, and may be connected to the semiconductor component via bumps. The bumps only need to be conductive, and the material is not limited. On the other hand, back surface terminals also only needs to be disposed in an array in the surface direction, and a ball (BGA) may be formed, a pin (PGA) may be formed, or a land (LGA) may be formed.

The electronic substrate only needs to be a substrate having a conductor layer and an insulating layer, and the method for forming the conductor layer and the insulating layer is not particularly limited. A first wiring and a second wiring are integral conductors that electrically connect the front surface terminals and the back surface terminals in the electronic substrate, and are constituted of in-plane wiring in the conductor layer and interlayer wiring in the insulating layer. In-plane wiring is a wiring pattern in the surface direction, and interlayer wiring is a wiring in the thickness direction (vias, through-holes, etc.).

The first wiring and the second wiring only need to be supplied with a power supply having the same potential from the main substrate, and the configuration only needs to be such that the main substrate supplies the power supply having the same potential to each of the back surface terminals connected to the first wiring and the second wiring. The first wiring and the second wiring only need to be electrically unconnected in the electronic substrate, and it goes without saying that the first wiring and the second wiring may be electrically connected via the wiring in the semiconductor component or the wiring in the main substrate. Further, the number of front surface terminals to which the first wiring and the second wiring are connected is not particularly limited. Similarly, the number of back surface terminals to which the first wiring and the second wiring are connected is not particularly limited.

In addition to the first wiring and the second wiring, an Nth wiring (N is an integer of 3 or more) having the same configuration as the first wiring and the second wiring may be provided. In this case, the configuration may be such that the Nth wiring electrically connects the front surface terminals and the back surface terminals in the electronic substrate, the power supply having the same potential as the first wiring is supplied to the Nth wiring from the main substrate via the back surface terminals, and the Nth wiring is not electrically connected to any of the first to (N−1) wirings in the electronic substrate.

Further, in a surface direction of the electronic substrate, a straight line that divides a first region in which the front surface terminals connected to the first wiring are distributed and a second region in which the front surface terminals connected to the second wiring are distributed may be definable. In this way, by making the first region and the second region dividable by one straight line, the front surface terminals connected to the first wiring and the front surface terminals connected to the second wiring can be made so as not to be intricately present on the surface of the electronic substrate. As a result, the wiring pattern of the first wiring and the wiring pattern of the second wiring in the conductor layers do not have to have a complicated shape, and the degree of freedom of other wiring patterns such as signal lines can be improved.

Furthermore, a distance between the front surface terminals connected to the first wiring and a distance between the front surface terminals connected to the second wiring may be shorter than a distance between the front surface terminals connected to the first wiring and the front surface terminals connected to the second wiring. By making the front surface terminals located close to each other the front surface terminals connected to the first wiring in this way, the area of the wiring pattern for the first wiring can be reduced, and the degree of freedom of other wiring patterns such as signal lines can be improved. Similarly, by making the front surface terminals located close to each other the front surface terminals connected to the second wiring, the area of the wiring pattern for the second wiring can be reduced.

Further, a first semiconductor component and a second semiconductor component may be mounted on the electronic substrate, and the first wiring may be connected to both of the front surface terminals connected to the first semiconductor component and the front surface terminals connected to the second semiconductor component. As a result, the power supply can be supplied to both of the first semiconductor component and the second semiconductor component via the first wiring. Needless to say, not only the first wiring but also the second wiring may be connected to both of the front surface terminals connected to the first semiconductor component and the front surface terminals connected to the second semiconductor component.

Furthermore, in the surface direction of the electronic substrate, the back surface terminal connected to the first wiring may exist inside a first region in which the front surface terminals connected to the first wiring are distributed. Thus, the back surface terminal connected to the first wiring can be disposed immediately below the first region in which the front surface terminals connected to the first wiring are distributed. As a result, the wiring length of the first wiring can be shortened, and the resistance of the first wiring can be reduced.

Furthermore, in the surface direction of the electronic substrate, the back surface terminal connected to the first wiring may exist outside a first region in which the front surface terminals connected to the first wiring are distributed. Thus, for example, the back surface terminal connected to the first wiring can be disposed near the outer edge of the electronic substrate. Instead, the back surface terminals connected to the signal lines or the like can be disposed near the center of the electronic substrate.

DESCRIPTION OF THE REFERENCE NUMERALS 10, 1010, 2010 . . . Electronic substrate, 100, 100A, 100B . . . Semiconductor component, 200 . . . Main substrate, C1 to C4 . . . First to fourth wiring, G . . . Center point, SRB, IB1 to IB2, CC, IF1 to IF2, SRF . . . Insulating layer, PB1 to PB3, PF1 to PF3 . . . Conductor layer, R1 to R4 . . . First to fourth region, TB . . . Back surface terminal, TF . . . Front surface terminal, V . . . Power supply, d . . . Bump pitch

The invention claimed is:

1. An electronic substrate that connects to a semiconductor component via a plurality of front surface terminals disposed in an array on a front surface and connects to a main substrate via a plurality of back surface terminals disposed in an array on a back surface, the electronic substrate comprising:
   a first wiring that electrically connects the front surface terminals and the back surface terminals in the electronic substrate and is supplied with a power supply from the main substrate via the back surface terminals; and
   a second wiring that electrically connects the front surface terminals and the back surface terminals in the electronic substrate, is supplied with the power supply having the same potential as the first wiring from the main substrate via the back surface terminals, and is not electrically connected to the first wiring in the electronic substrate.

2. The electronic substrate according to claim 1, wherein in a surface direction of the electronic substrate, a straight line that divides a first region in which the front surface terminals connected to the first wiring are distributed and a second region in which the front surface terminals connected to the second wiring are distributed is definable.

3. The electronic substrate according to claim 1, wherein a maximum distance between the front surface terminals adjacent each other and connected to the first wiring and a maximum distance between the front surface terminals adjacent each other and connected to the second wiring are shorter than a minimum distance between the front surface terminals connected to the first wiring and the front surface terminals connected to the second wiring.

4. The electronic substrate according to claim 1, wherein a first semiconductor component and a second semiconductor component are mounted on the electronic substrate, and the first wiring is connected to both of the front surface terminals connected to the first semiconductor component and the front surface terminals connected to the second semiconductor component.

5. The electronic substrate according to claim 1, wherein in the surface direction of the electronic substrate, one of the back surface terminals connected to the first wiring exists inside a first region in which the front surface terminals connected to the first wiring are distributed.

6. The electronic substrate according to claim 1, wherein in the surface direction of the electronic substrate, one of the back surface terminals connected to the first wiring exists outside a first region in which the front surface terminals connected to the first wiring are distributed.

* * * * *